United States Patent
Yamashita (10) Patent No.: US 6,519,750 B2
(45) Date of Patent: Feb. 11, 2003

(54) METHOD OF DESIGNING LAYOUT FOR INTEGRATED CIRCUIT

(75) Inventor: Katsuhiro Yamashita, Kanagawa (JP)

(73) Assignee: NEC Corporation, Tokyo (JP)

( * ) Notice: Subject to any disclaimer, the term of this patent is extended or adjusted under 35 U.S.C. 154(b) by 108 days.

(21) Appl. No.: 09/803,939

(22) Filed: Mar. 13, 2001

(65) Prior Publication Data

US 2001/0021992 A1 Sep. 13, 2001

(30) Foreign Application Priority Data

Mar. 13, 2000 (JP) ............................ 2000-068149

(51) Int. Cl.$^7$ ................................. G06F 9/45
(52) U.S. Cl. ............................ 716/10; 716/13
(58) Field of Search .................. 716/5, 6, 8, 9, 716/10, 12, 13, 14

(56) References Cited

U.S. PATENT DOCUMENTS 5,801,960 A * 9/1998 Takano et al. ............. 364/491
6,260,179 B1 * 7/2001 Ohsawa et al. ............... 716/5
6,266,803 B1 * 7/2001 Scherer et al. ............. 716/12

FOREIGN PATENT DOCUMENTS

JP  11-119854  4/1999
JP  11-175579  7/1999

OTHER PUBLICATIONS

NEC Corporation, User's manual (CAD Tool, CB–C9 family, VX/VM type, for 0.35 μm CMOS, cell–based ICs, Design section), Jul. 1997, pp. 5–26–5–33.

* cited by examiner

Primary Examiner—Sara Crane
(74) Attorney, Agent, or Firm—McGinn & Gibb, PLLC (57) ABSTRACT

A method of designing the layout for an IC is provided, which eliminates the signal line re-routing process and which optimizes the relative skew of the clock signal. This method comprises the steps of: (a) determining prohibited areas in each of stacked wiring layers; the prohibited areas causing an obstacle to determine layout of signal lines in each of the wiring layers if clock lines are defined to intersect the prohibited areas; (b) defining layout of clock lines in each of wiring layers through a Clock Tree Synthesis process in such a way that none of the clock lines intersects the prohibited areas; and (c) defining layout of signal lines in each of the wiring layers after the step (b). Preferably, prohibited area information about a primitive cell including at least one of the prohibited areas is provided, where the prohibited area information is used in the CTS process in the step (b).

10 Claims, 11 Drawing Sheets

METHOD OF DESIGNING LAYOUT FOR INTEGRATED CIRCUIT

BACKGROUND OF THE INVENTION

1. Field of the Invention

The present invention relates to a method of designing integrated circuits (ICs) and more particularly, to a method of designing the layout for ICs using a Computer-Aided Designing (CAD) system or tool, which makes it possible to route the signal lines without their re-routing process.

2. Description of the Related Art

Conventionally, well-known Application Specific Integrated Circuits (ASICs) termed Gate Arrays, Standard Cells, and so on have been designed using a CAD tool, in which the Clock Tree Synthesis (CTS) process has become to play an important role. The CTS process is a process to control the propagation delay of a clock signal by assigning a clock driver (i.e., buffer) to each cell array to thereby adjust the delay with the extra capacitance and resistance added by the driver.

With the CTS process, the clock lines for the respective blocks or cells are synthesized in the form of a tree and then, buffers having high driving capability are assigned to the respective branches of the clock line tree. Thus, the relative skew (i.e., the phase difference) of the propagated clock signal among the blocks and/or cells are suppressed, in other words, the clock skew is reduced.

The CTS process is well known and therefore, no further explanation will be needed. However, an example of the documents explaining this process is as follows:

The user's manual (provisional) of the CAD tool, CB-C9 family, VX/VM type, for 0.35 μtm CMOS cell-based ICs, Design section, published by NEC corporation in 1997.

An example of a prior-art method of designing the layout for ICs using a CAD tool will be explained below with reference to FIGS. 1 to 6.

Figure 1:
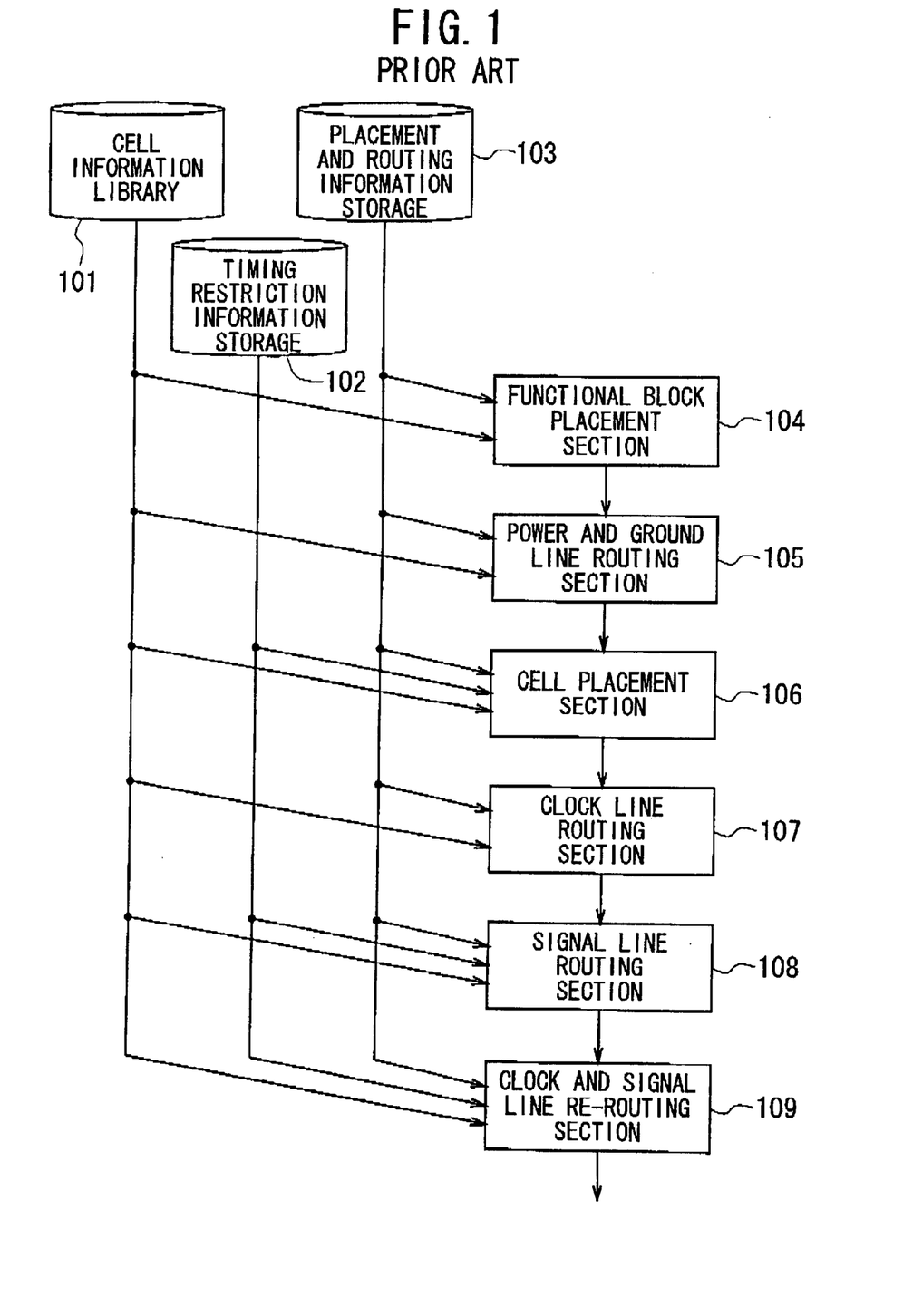
FIG. 1 is a schematic, functional block diagram showing the configuration of the layout section of a CAD tool for conducting a prior-art method of designing the layout for ICs.

FIG. 1 shows the layout section of a CAD tool for conducting the prior-art method. The layout section of FIG. 1 comprises a cell information library 101, a timing restriction information storage 102, a placement and routing information storage 103, a functional block placement section 104, a power and ground line routing section 105, a cell placement section 106, a clock line routing section 107, a signal line routing section 108, and a clock and signal line re-routing section 109.

The cell information library 101 stores the cell information for defining the primitive cells. Each of the primitive cells has one of the minimum functions (e.g., a NAND or NOR circuit, an inverter, a buffer, and a flip-flop) that have been prepared to design cell-based ICs. Also, the library 101 stores the wiring layer information for defining the extending direction of the respective wiring layers in the primitive cells.

The cell information in the library 101 is read out and sent to the functional block placement section 104 and the cell placement section 106 as necessary. Also, the cell information and the wiring layer information in the library 101 is read out and sent to the power and ground line routing section 105, the clock line routing section 107, the signal line routing section 108, and the clock and signal line re-routing section 109 as necessary.

The timing restriction information storage 102 stores the timing restriction information about the temporal restriction in signal transmission among the logic elements (i.e., about the timing restriction of the signals other than the clock signal). The timing restriction information in the storage 102 is read out and sent to the cell placement section 106 and the signal line routing section 108 as necessary.

The placement and routing information storage 103 stores the placement information of the primitive cells in the form of net list and the routing information of the wiring lines among the primitive cells. The placement information and the routing information is read out and sent to the functional block placement section 104, the power and ground line routing section 105, the cell placement section 106, the clock line routing section 107, the signal line routing section 108, and the clock and signal line re-routing section 109 as necessary.

The functional block placement section 104 determines the functional blocks (i.e., the areas where the primitive cells are functionally separated and laid out), forming a floor plan. This operation is performed on the basis of the cell information from the library 101 and the placement and routing information from the storage 103. Then, the section 104 supplies the result of the placement (i.e., the floor plan) to the power and ground line routing section 105.

The power and ground line routing section 105 conducts the routing operation of the power supply lines and the ground lines on the basis of the cell information from the library 101 and the routing information of the wiring layers from the storage 103. Then, the section 105 supplies the result of the routing operation to the cell placement section 106.

The cell placement section 106 determines the layout of the primitive cells for each functional block on the basis of the cell information from the library 101, the placement and routing information from the storage 103, and the timing restriction information from the storage 102. Then, the section 106 supplies the result of the layout operation to the clock line routing section 107.

The clock line routing section 107 conducts the CTS process on the basis of the cell information from the library 101 and the placement and routing information from the storage 103, thereby determining the routing of the clock lines for each primitive cell. Then, the section 107 supplies the result of the clock line routing operation to the signal line routing section 108.

The signal line routing section 108 conducts the routing operation of the signal lines for each primitive cell on the basis of the cell information from the library 101, the placement and routing information from the storage 103, and the timing restriction information from the storage 102. Then, the section 108 supplies the result of the signal line routing operation to the clock and signal line re-routing section 109.

The clock and signal line re-routing section 109 searches the result of the signal line routing operation thus sent and extracts the short-circuited ones therefrom. Then, the section 109 conducts the re-routing operation (i.e., amends the existing layout) of the short-circuited signal lines and the relating clock lines to eliminate the short-circuited ones on the basis of the cell information from the library 101, the placement and routing information from the storage 103, and the timing restriction information from the storage 102. Thus, the section 109 generates the final result of the layout operation and outputs it as the final layout information.

Figure 2:
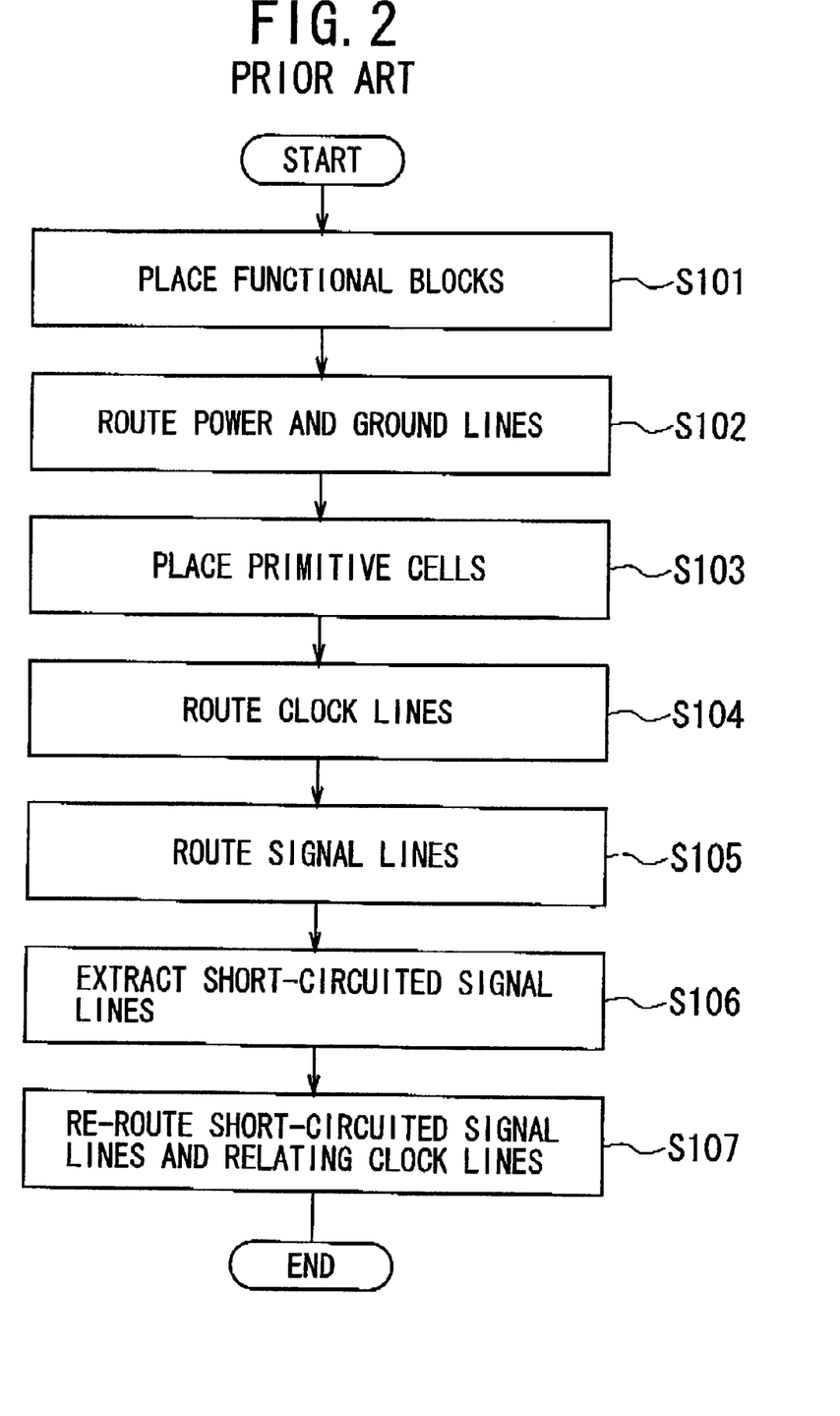
FIG. 2 is a flowchart showing the process steps of the prior-art method of designing the layout for ICs.

FIG. 2 shows a prior-art layout method conducted with the layout system shown in FIG. 1.

First, in the step S101, the functional block placement section 104 places the functional blocks including the primitive cells to form a floor plan on the basis of the cell information from the library 101 and the placement and routing information from the storage 103.

In the next step S102, the power and ground line routing section 105 determines the routes of the power lines and the ground lines on the basis of the cell information and the wiring layer information from the library 101.

In the next step S103, the cell placement section 106 places the primitive cells in each of the functional blocks on the basis of the cell information from the library 101, the placement and routing information from the storage 103, and the timing restriction information from the storage 102. In this process, the primitive cells are laid out at the specific positions where the timing of the ordinary signals other than the clock signal is judged optimum. If the timing restriction information is not satisfied after a layout of the primitive cells is completed, this layout is amended. This amendment process of the layout is repeated until the restriction information is satisfied.

Figure 3:
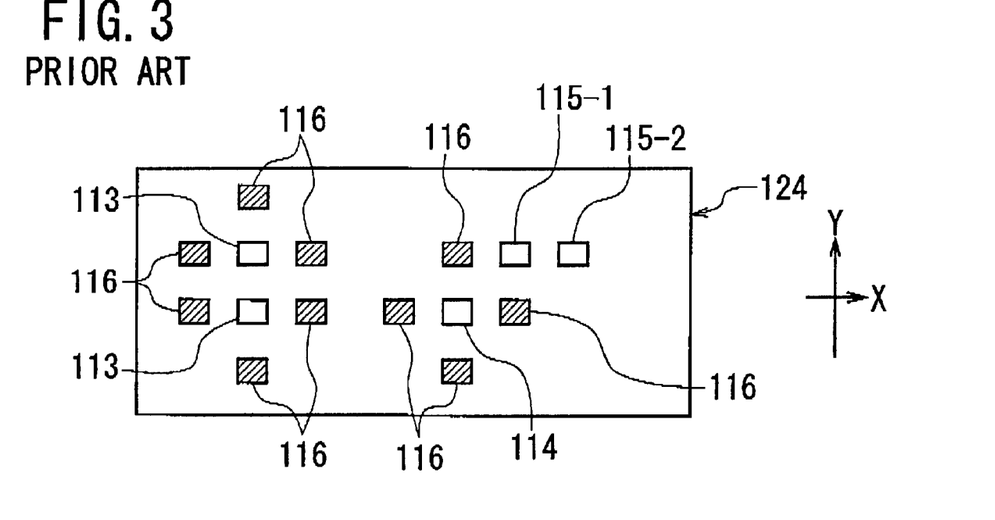
FIG. 3 is a schematic plan view showing an example of the layout of terminals and prohibited areas in a primitive cell.

FIG. 3 shows an example of a primitive cell defined by the cell information from the storage 101. The primitive cell 124 in FIG. 3 has connectable terminals 113, 114, 115-1, and 115-2 to which the wiring lines in the (n−1) th wiring layer are connectable, where n is a natural number greater than unity. The cell 124 has prohibited areas 116 also. The wiring lines in the (n−1)-th wiring layer are prohibited from overlapping with the areas 116.

In the step S103, the primitive cell 124 and/or any other primitive cell (not shown) is assigned to each of the functional blocks where the routes of the power and ground lines has been determined in the step S102.

In the next step S104, the clock line routing section 107 conducts the CTS process on the basis of the cell information from the library 101 and the placement and routing information from the storage 103, determining the routes of the clock lines for each primitive cell. Specifically, the section 107 determines the routes of the clock lines so as to amend the dispersion or fluctuation of the propagation delay of the same clock signal in the respective branched clock lines. Through this CTS process, the clock lines are laid out in such a way that the relative skew of the clock signal is minimized in the whole IC.

Figure 4:
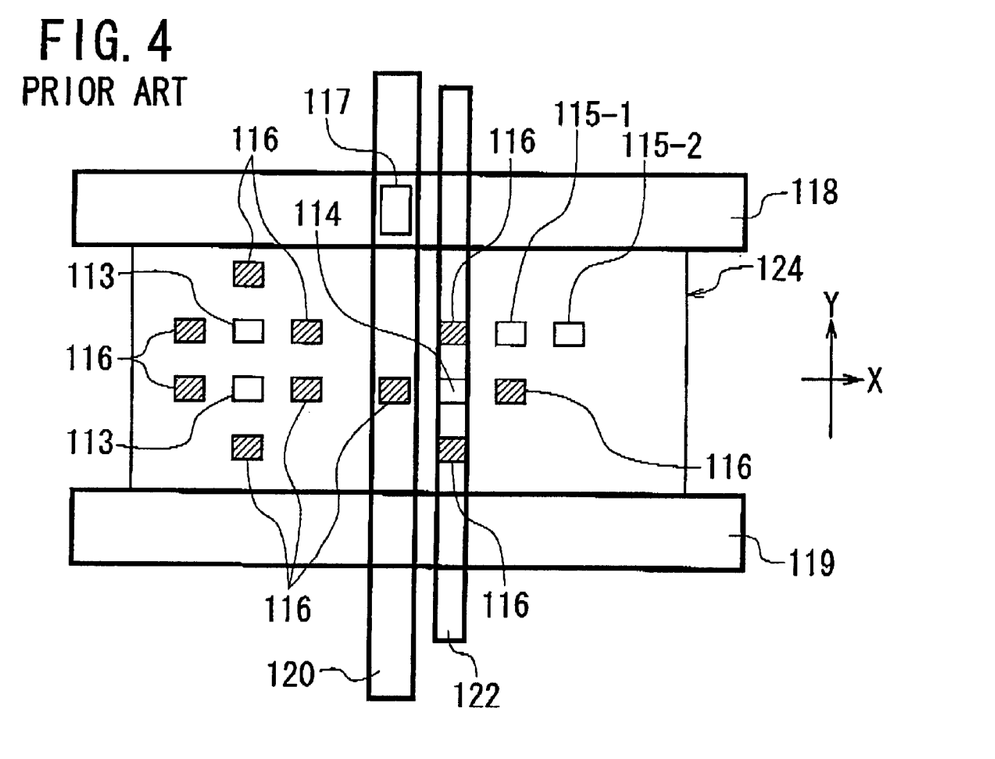
FIG. 4 is a schematic plan view showing the state of the primitive cell of FIG. 3 after the steps S101 to S104 in FIG. 2 are completed.

FIG. 4 shows the result of the above-described steps S101 to S104 in the primitive cell 124 of FIG. 3. As seen from FIG. 4, a power supply line 118 and a ground line 119 in the (n−1)th wiring layer are respectively laid out at the top and bottom of the cell 124 horizontally (i.e., in the X direction). A power supply line 120 in the n-th wiring layer, which is connected to the underlying power line 118 by way of a through hole 117, is laid out vertically (i.e., in the Y direction) to overlap with one of the underlying prohibited areas 116. A clock line 122 in the n-th wiring layer is laid out vertically to overlap with the connectable terminal 114 and two of the underlying prohibited areas 116. The clock line 122 is adjacent and parallel to the power line 120.

Although the power line 120 and the clock line 122 are overlapped with one of the prohibited areas 116 and at the same time, the clock line 122 is overlapped with the terminal 114 and the two of the areas 122, no problem occurs. This is because the lines 120 and 122 are located in the n-th wiring layer while the areas 116 prohibits the overlapping in the (n−1)-th wiring layer and the terminal 114 is connectable to the wiring lines in the (n−1)-th wiring layer.

In the next step S105, the signal line routing section 108 determines the routes of the signal lines for each of the primitive cells on the basis of the cell information from the library 101, the placement and routing information from the storage 103, and the timing restriction information from the storage 102.

Figure 5:
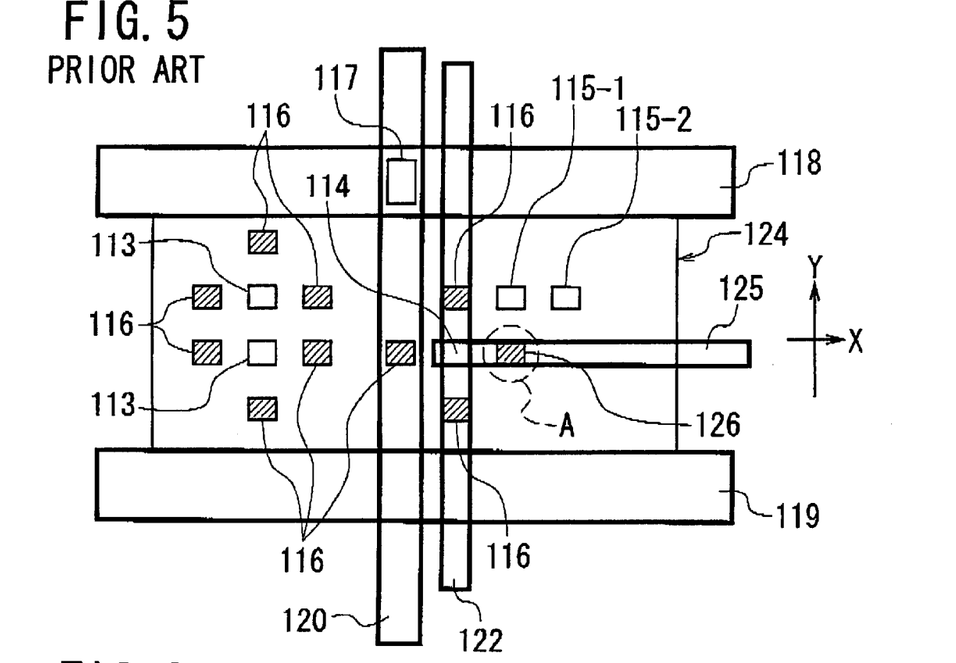
FIG. 5 is a schematic plan view showing the state of the primitive cell of FIG. 3 after the step S105 in FIG. 2 is completed.

In the primitive cell shown in FIG. 3, a signal line (not shown) to be connected to the terminal 114 in the n-th wiring layer is unable to be connected to the terminal 114. This is because the clock line 122 has been placed to overlap with the terminal 114 in the n-th wiring layer after the step S104, as shown in FIG. 4. Therefore, in the step S105, as shown in FIG. 5, a horizontal signal line 125 extending in the X direction is placed in the (n−1)-th wiring layer. In this case, however, the signal line 125 overlaps with one of the prohibited areas 116 in the (n−1)-th wiring layer located in the circle 126, resulting in unwanted short-circuit of the signal line 125.

Accordingly, in the next step S106, the clock and signal line re-routing section 109 extracts the signal lines thus short-circuited on the basis of the routing result of the signal lines outputted from the signal line routing section 108.

In the next step S107, the clock and signal line re-routing section 109 performs the re-routing operation of the short-circuited signal lines thus extracted and their relating clock lines on the basis of the cell information from the library 101, the placement and routing information from the storage 103, and the timing restriction information from the storage 102.

Figure 6:
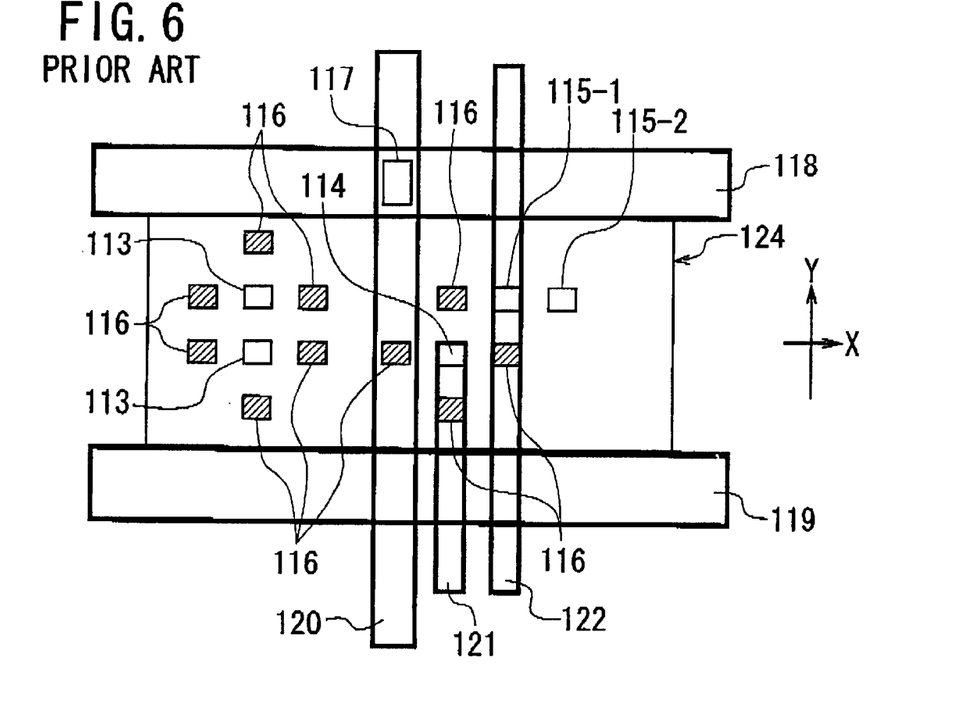
FIG. 6 is a schematic plan view showing the state of the primitive cell of FIG. 3 after the steps S106 and S107 in FIG. 2 are completed.

In the primitive cell 124 shown in FIG. 3, after the step S107, as shown in FIG. 6, the vertical clock line 122 placed in the n-th wiring layer to overlap with the underlying terminal 114 (see FIG. 5) is shifted toward the right-hand side (i.e., toward the +X direction) in the same n-th wiring layer until the line 122 overlaps with the underlying terminal 115-1. At the same time, a vertical signal line 121 is additionally provided in the (n−1)-th wiring layer between the power line 120 and the clock line 122. Thus, the signal line 121 thus added is connected to the terminal 114 at its end in the (n−1)-th wiring layer. A signal line such as the line 121 with its end on a terminal is termed a "cushion".

For example, for a cell-based IC having approximately 790×10$^3$ transistors and approximately 58×10$^3$ cells, the re-routing operation as described here needs to be conducted at approximately 2000 positions.

Alternately, if the horizontal short-circuited signal line 125, which overlaps with one of the prohibited areas 116 as shown in the circle 126 of FIG. 5, is not re-routed in the step S107, there is a possibility that the terminal 114 is kept unconnected or unwired.

As explained above, with the prior-art layout method as shown in FIG. 2, there is a problem that short-circuit of the signal lines tends to occur and as a result, the re-routing operation of the clock lines is essentially required to eliminate the short-circuited signal lines.

Moreover, because of the re-routing operation of the clock lines, the relative skew of the clock signal that has been adjusted to be minimized or optimized through the CTS process is changed, resulting in another problem that the relative skew of the clock signal deteriorates.

Unless the re-routing operation is not conducted, there is a further problem that short-circuited signal lines and unconnected terminals may be left.

SUMMARY OF THE INVENTION

Accordingly, an object of the present invention is to provide a method of designing the layout for an IC that eliminates the necessity of the above-described re-routing operation of the signal lines.

Another object of the present invention is to provide a method of designing the layout for an IC that makes it possible to optimize or minimize the relative skew of the clock signal.

Still another object of the present invention is to provide a method of designing the layout for an IC that eliminates short-circuited signal lines and unconnected terminals.

The above objects together with others not specifically mentioned will become clear to those skilled in the art from the following description.

According to a first aspect of the present invention, a method of designing layout for an IC using a CAD system is provided. This method comprises the steps of:

(a) defining prohibited areas in each of stacked wiring layers;
   the prohibited areas causing an obstacle to define layout of signal lines in each of the wiring layers if a clock line is defined to intersect at least one of the prohibited areas;

(b) defining layout of clock lines in each of wiring layers through a clock tree synthesis process in such a way that none of the clock lines intersects the prohibited areas; and (c) defining layout of signal lines in each of the wiring layers after the step (b).

With the method of designing layout for an IC according to the first aspect of the invention, the prohibited areas are defined in each of stacked wiring layers in the step (a), where the prohibited areas are areas that cause an obstacle to define the layout of the signal lines in each of the wiring layers if a clock line is defined to intersect at least one of the prohibited areas. Then, in the step (b), the layout of the clock lines is defined in each of the wiring layers through a clock tree synthesis process in such a way that none of the clock lines intersects the prohibited areas. Thereafter, in the step (c), the layout of signal lines is defined in each of the wiring layers. Accordingly, there is no possibility that some of the signal lines is/are shifted (i.e., the layout of the signal lines is partially redefined) in the step (c) due to existence of the clock line or lines that has/have been already defined.

As a result, the re-routing operation of the signal lines required in the above-described prior-art method can be eliminated. This will eliminate short-circuited signal lines and unconnected terminals.

Moreover, since there is no possibility to redefine the optimized layout of the clock lines, the relative skew of the clock signal is optimized or minimized.

In a preferred embodiment of the method according to the first aspect, each of the prohibited areas includes a terminal to which one of the signal lines is to be connected.

In another preferred embodiment of the method according to the first aspect, a step of providing prohibited area information about a primitive cell including at least one of the prohibited areas is additionally provided. Then, the prohibited area information is used in the clock tree synthesis process in the step (b).

In still another preferred embodiment of the method according to the first aspect, a step of providing prohibited terminal information about terminals corresponding to the prohibited areas is additionally provided. Then, the prohibited terminal information is used in the clock tree synthesis process in the step (b).

In a further preferred embodiment of the method according to the first aspect, the clock lines and the signal lines are located in a same one of the wiring layers. In this embodiment, it is preferred that the clock lines and the signal lines extend in a same direction.

According to a second aspect of the present invention, another method of designing layout for an IC using a CAD system is provided. This method comprises the steps of:

(a) providing prohibited area information about primitive cells including at least one of prohibited areas;
   the prohibited areas causing an obstacle to define layout of signal lines if clock lines are defined to intersect the prohibited areas;

(b) providing cell information about primitive cells excluding the prohibited areas;

(c) placing functional blocks using the cell information;

(d) routing power lines and ground lines using the cell information;

(e) placing primitive cells using the cell information;

(f) routing clock lines through a clock tree synthesis process using the prohibited area information; and (g) routing signal lines using the cell information.

With the method of designing layout for an IC according to the second aspect of the invention, the prohibited area information about primitive cells including at least one of prohibited areas is provided in the step (a) and the cell information about primitive cells excluding the prohibited areas is provided in the step (b). The prohibited areas cause an obstacle to define layout of signal lines if clock lines are defined to intersect the prohibited areas.

Furthermore, the functional blocks are placed using the cell information in the step (c), the power lines and ground lines are routed using the cell information in the step (d); the primitive cells are placed using the cell information in the step (e); the clock lines are routed in the step (f) through a clock tree synthesis process using the prohibited area information, and the signal lines are routed in the step (g) using the cell information.

Accordingly, the re-routing process of the signal lines required in the above-described prior-art method can be eliminated. This will prevent short-circuit of the signal lines and occurrence of the unconnected terminals. Also, since there is no possibility to redefine the optimized layout of the clock signals, the relative skew of the clock signal is optimized.

In a preferred embodiment of the method according to the second aspect, placement information about the primitive cells and routing information about wiring lines (i.e., the signal lines and the clock lines) among the primitive cells is used in each of the steps (c) to (g). Timing restriction information is additionally used in each of the steps (e) and (f).

According to a third aspect of the present invention, still another method of designing layout for an IC using a CAD system is provided. This method comprises the steps of:

(a) providing prohibited terminal information about primitive cells including at least one of prohibited terminals;
   the prohibited terminals causing an obstacle to define layout of signal lines if clock lines are defined to intersect the prohibited terminals;

(b) providing cell information about primitive cells excluding the prohibited terminals;

(c) placing functional blocks using the cell information;

(d) routing power lines and ground lines using the cell information;

(e) placing primitive cells using the cell information;

(f) routing clock lines through a clock tree synthesis process using the prohibited terminal information; and (g) routing signal lines using the cell information.

With the method of designing layout for an IC according to the third aspect of the invention, the same process steps are carried out, except that the prohibited terminal information is used instead of the prohibited area information in the method according to the second aspect. Therefore, the same advantage as those in the method of the second aspect are given.

In a preferred embodiment of the method according to the third aspect, placement information about the primitive cells and routing information about wiring lines (i.e., the signal lines and the clock lines) among the primitive cells is used in each of the steps (c) to (g). Timing restriction information is additionally used in each of the steps (e) and (f).

BRIEF DESCRIPTION OF THE DRAWINGS

In order that the present invention may be readily carried into effect, it will now be described with reference to the accompanying drawings.

DETAILED DESCRIPTION OF THE PREFERRED EMBODIMENTS

Preferred embodiments of the present invention will be described in detail below while referring to the drawings attached.

First Embodiment

Figure 7:
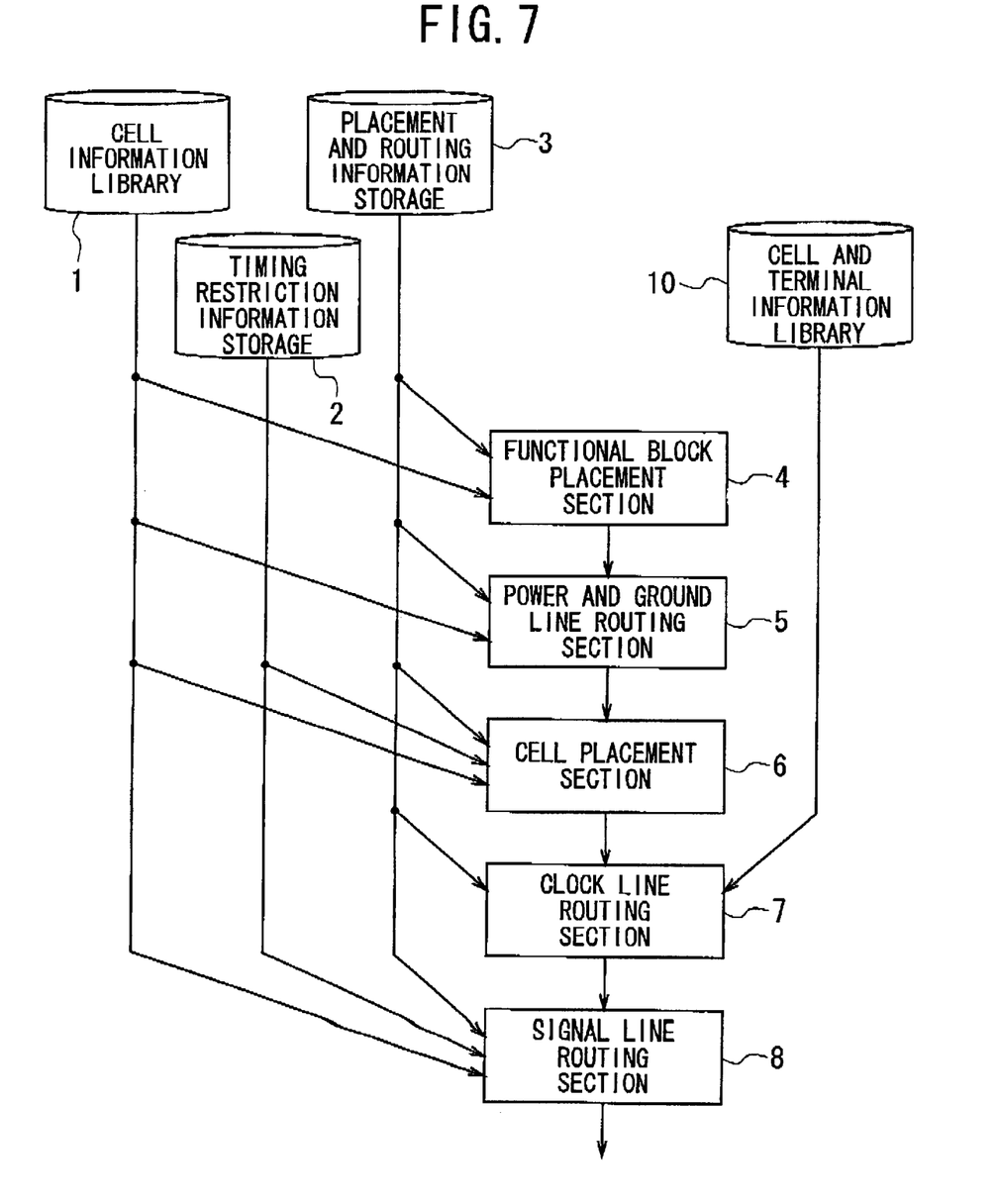
FIG. 7 is a schematic, functional block diagram showing the configuration of the layout section of a CAD tool for conducting a method of designing the layout for ICs according to a first embodiment of the invention.

A method of designing the layout for an IC according to a first embodiment of the invention is conducted using a CAD tool, the layout section of which is shown in FIG. 7.

The layout section of the CAD tool in FIG. 7 comprises a cell information library 1, a timing restriction information storage 2, a placement and routing information storage 3, a functional block placement section 4, a power and ground line routing section 5, a cell placement section 6, a clock line routing section 7, a signal line routing section 8, and a cell and terminal information storage 10.

The cell information library 1 stores the cell information for defining the primitive cells each of which has a minimum function (e.g., a NAND or NOR circuit, an inverter, a buffer, and a flip-flop) that have been prepared to design cell-based ICs. Also, the library 1 stores the wiring layer information for defining the extending direction of the wiring layers.

The cell information in the library 1 is read out and sent to the functional block placement section 4 and the cell placement section 6 as necessary. The cell information and the wiring layer information in the library 1 is read out and sent to the power and ground line routing section 5 and the signal line routing section 8 as necessary.

The timing restriction information storage 2 stores the timing restriction information about the temporal restriction in signal transmission among the logic elements (i.e., about the timing restriction of the signals other than the clock signal). The timing restriction information in the storage 2 is read out and sent to the cell placement section 6 and the signal line routing section 8 as necessary.

The placement and routing information storage 3 stores the placement information of the primitive cells in the form of net list and the routing information of the wiring lines among the primitive cells. Moreover, the storage 3 stores the placement information about the placement of large-sized functional blocks, such as the interface block for interconnection with the outside of the IC, the Read-Only Memory (ROM) block, the Random-Access Memory (RAM) block, the Central Processing Unit (CPU) block, and the CPU peripherals block, and the routing information of the wiring lines for these large-sized functional blocks.

The placement information of the primitive cells and the large-sized functional blocks and their routing information of the wiring lines in the storage 3 may be simply termed the "placement and routing information" below. The "placement and routing information" in the storage 3 is read out and sent to the functional block placement section 4, the power and ground line routing section 5, the cell placement section 6, the clock line routing section 7, and the signal line routing section 8 as necessary.

The cell and terminal information library 10 stores the same cell information as that stored in the cell information library 1 and the "terminal information" that defines whether or not each of the terminals in each cell is prohibited from being overlapped (or intersected) by a wiring line or lines in each wiring layer. The cell information and the terminal information is sent to the clock line routing section 7 as necessary.

The functional block placement section 4 defines the functional blocks (i.e., the areas where the primitive cells are functionally separated and laid out) and places the large-sized functional blocks, forming a floor plan. This operation is performed on the basis of the cell information from the library 1 and the placement and routing information from the storage 3. Then, the section 4 supplies the result of the layout (i.e., the floor plan) of the functional blocks to the power and ground line routing section 5.

The power and ground line routing section 5 conducts the routing operation of the power supply lines and the ground lines for each of the large-sized functional block and the functional blocks containing the primitive cells on the basis of the cell information and the wiring layer information from the library 1. Then, the section 5 supplies the result of the routing operation of the power and ground lines to the cell placement section 6.

The cell placement section 6 defines the layout of the primitive cells for each functional block on the basis of the cell information from the library 1, the placement and routing information from the storage 3, and the timing restriction information from the storage 2. Then, the section 105 supplies the result of the layout operation of the primitive cells to the clock line routing section 7.

The clock line routing section 7 conducts the CTS process on the basis of the cell information from the library 1, the placement and routing information from the storage 3, and the timing restriction information from the storage 2, thereby defining the routes of the clock lines for each large-sized block and each primitive cell. Then, the section 7 supplies the result of the routing operation of the clock lines to the signal line routing section 8.

The signal line routing section 8 defines the routes of the signal lines (which exclude the clock lines) for each large-sized block and each primitive cell on the basis of the cell information from the library 1, the placement and routing information from the storage 3, and the timing restriction information from the storage 2. Then, the section 8 outputs the final result of the layout information.

Figure 8:
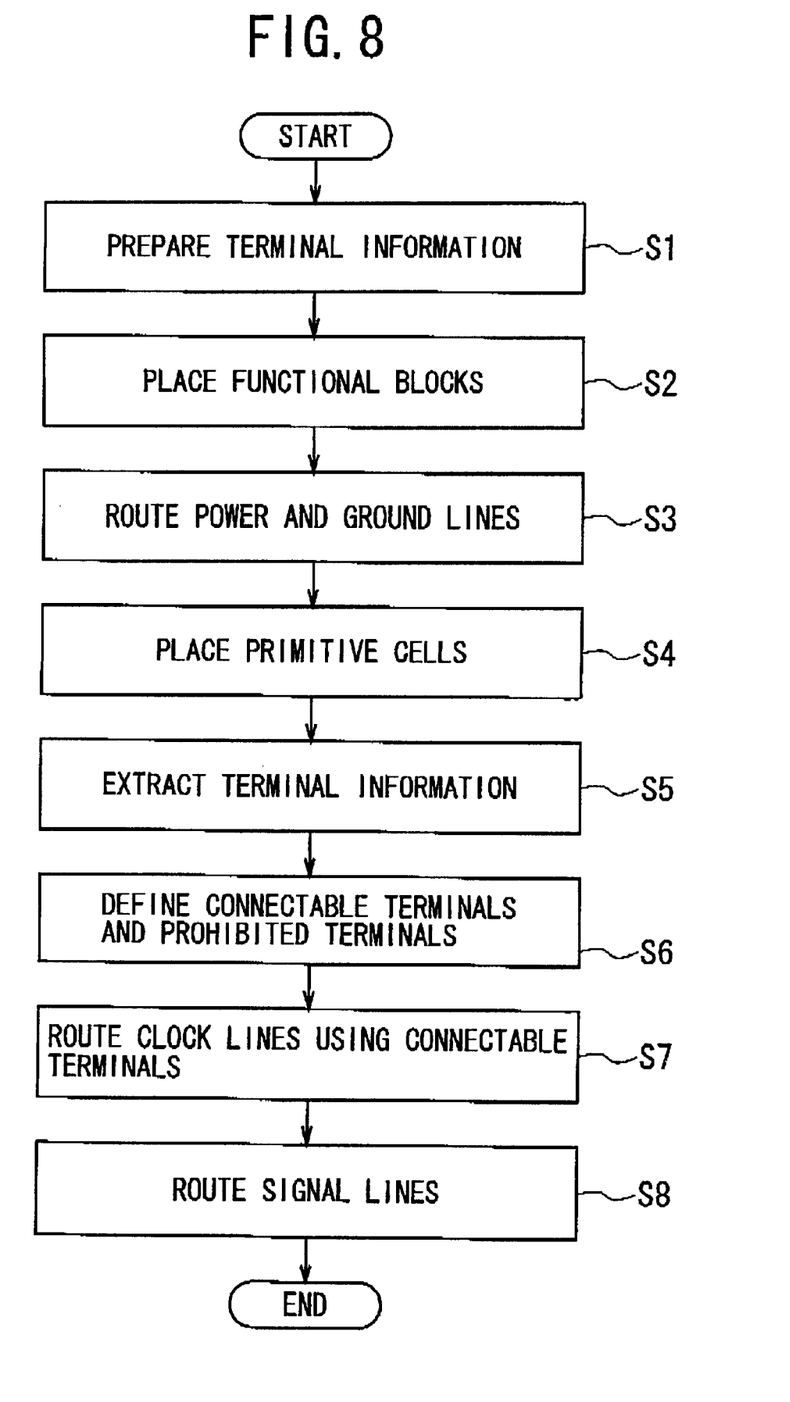
FIG. 8 is a flowchart showing the process steps of the method according to the first embodiment of the invention.

FIG. 8 shows the process steps of the method of designing the layout for an IC according to the first embodiment, in which the layout system shown in FIG. 7 is used.

First, in the step S1, the terminal information is prepared and then, it is stored in the cell and terminal information library 10.

In the next step S2, the functional block placement section 4 places or lays out the large-sized functional blocks and the other functional blocks including the primitive cells to form a floor plan on the basis of the cell information from the library 1 and the placement and routing information from the storage 3.

In the next step S3, the power and ground line routing section 5 determines the routes of the power lines and the ground lines on the basis of the cell information from the library 1 and the placement and routing information from the storage 3. At this time, the size and interval of the trunk or main power and ground lines are determined by automatic calculation with a calculator or hand calculation by a person, in which specific values causing no malfunction in the IC are found while taking the voltage drop due to power consumption into consideration.

In the next step S4, the cell placement section 6 assigns the primitive cell or cells to each of the functional blocks on the basis of the cell information from the library 1 and the placement and routing information from the storage 3, and the timing restriction information from the storage 2. In other words, the section 6 selects some of the various primitive cells listed in the cell information as identified by the placement and routing information and then, places the cells thus selected in each functional block. Through repetition of this selection and placement operations, the layout of the primitive cells is completed.

In this step S4, the primitive cells are laid out at the specific positions where the timing of the ordinary signals other than the clock signal is judged optimum. If the timing restriction information is not satisfied after a layout of the primitive cells is completed, the layout is amended. This amendment process of the layout is repeated as necessary until the restriction information is satisfied.

In the next step S5, the clock line routing section 7 extracts the terminal information for each of the primitive cells thus laid out in the step S4.

In the next step S6, the clock line routing section 7 determines whether or not a line or lines in each wiring layer is/are prohibited from overlapping with each terminal on the basis of the terminal information thus extracted. In other words, the section 7 defines the "connectable terminals" that are allowed to be connected a line or lines in a specific wiring layer and the "prohibited terminals" that are prohibited from being connected to a line or lines in the same wiring layer.

Figure 9:
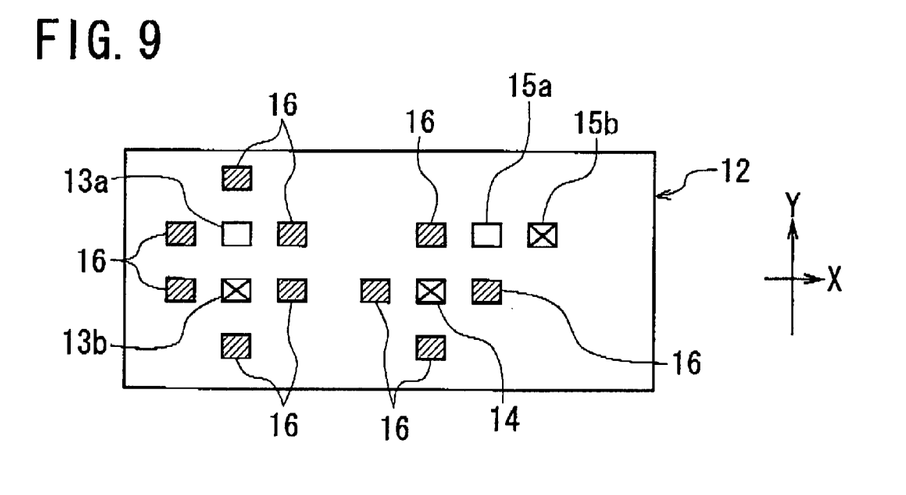
FIG. 9 is a schematic plan view showing an example of the layout of terminals and prohibited areas in a primitive cell used in the method according to the first embodiment of the invention.

FIG. 9 shows an example of the primitive cell defined by the cell information and the terminal information.

The primitive cell 12 shown in FIG. 9, which is defined by the cell information, has connectable terminals 13a, 13b, 14, 15a, and 15b and prohibited areas 16. The wiring lines in the (n–1)-th wiring layer are connectable to the terminals 13a, 13b, 14, 15a, and 15b while they are prohibited from overlapping or intersecting with the areas 16. The terminal information prescribes that the terminals 13a and 15a are allowed to overlap or intersect with a wiring line or lines in the n-th wiring layer and that the terminals 13b, 14, and 15b are prohibited from overlapping or intersecting with a wiring line or lines in the n-th wiring layer. Thus the terminals 13a and 15a are "connectable terminals" for the wiring line or lines in the n-th wiring layer while the terminals 13b, 14, and 15b are prohibited terminal for the wiring line or lines in the n-th wiring layer.

In the next step S7, the clock line routing section 7 conducts the CTS process on the basis of the cell information from the library 1 and the placement and routing information from the storage 3, defining the routes of the clock lines for each primitive cell. Specifically, the section 7 determines the routes or layout of the clock lines so as to amend the dispersion or fluctuation of the propagation delay of the same clock signal in the respective branched clock lines. Through this CTS process, the clock lines are laid out in such a way that the relative skew of the clock signal is minimized in the whole IC and that none of the clock lines overlap with the inhibited terminals 13b, 14, and 15b with respect to the lines in the n-th wiring layer.

Figure 10:
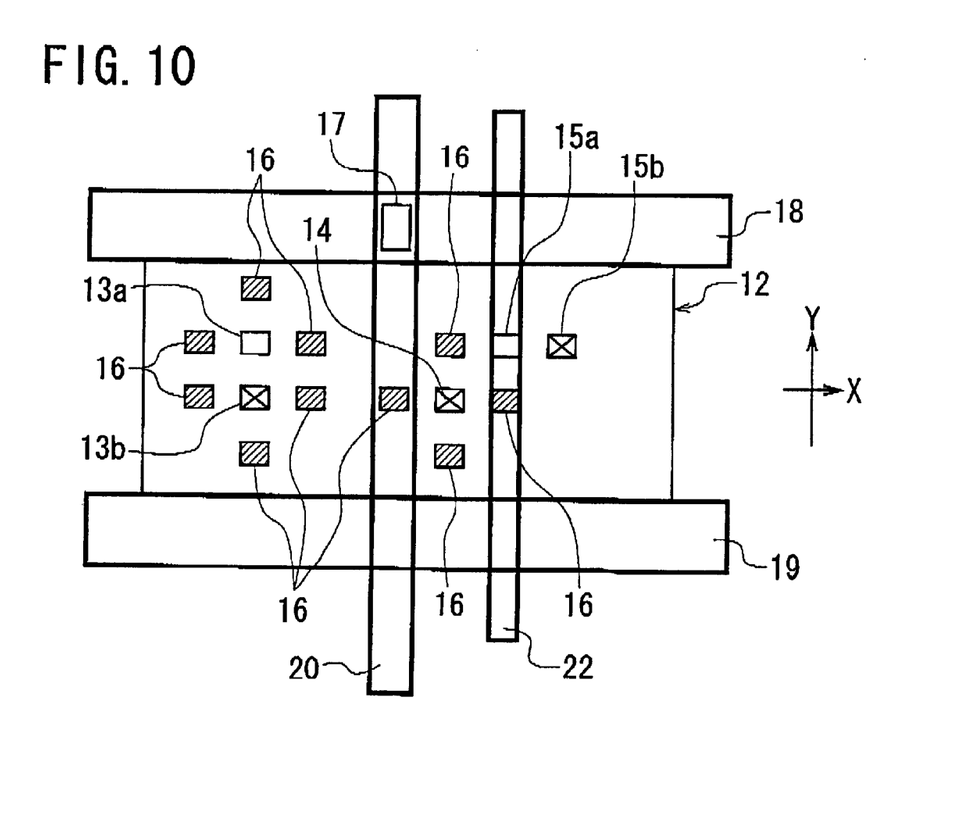
FIG. 10 is a schematic plan view showing the state of the primitive cell of FIG. 9 after the steps S1 to S7 in FIG. 8 are completed.

FIG. 10 shows the result of the above-described steps S1 to S7 in the primitive cell 12 of FIG. 9. As seen from FIG. 10, a power supply line 18 and a ground line 19 in the (n–1)th wiring layer are respectively laid out at the top and bottom of the cell 12 horizontally (i.e., in the X direction). A power supply line 20 in the n-th wiring layer is laid out vertically (i.e., in the Y direction) to overlap with the connectable terminal 15a. The line 20 is connected to the underlying power line 18 in the (n–1)-th wiring layer by way of a through hole 17.

Moreover, a clock line 22 is laid out vertically to be parallel to the power line 20 in such a way as to overlap with the connectable terminal 15a in the n-th wiring layer. This is because the terminals 14 and 15b adjacent to the terminal 15a are the prohibited terminals for the lines in the n-th wiring layer.

As seen from FIG. 10, the vertical power line 20 is overlapped with one of the underlying prohibited areas 16. However, no problem occurs. This is because the line 20 is located in the n-th wiring layer while the areas 16 are prohibited from overlapping with any lines located in the (n−1)-th wiring layer. This is applicable to the clock line 22 as well.

In the state shown in FIG. 10 including the vertical clock line 22, the CTS process is conducted so that the relative skew of the clock signal is minimized in the whole IC.

In the next step S8, the signal line routing section 8 determines the routes of the signal lines for each of the primitive cells and the large-sized functional blocks in each of the wiring layers on the basis of the cell information from the library 1, the placement and routing information from the storage 3, and the timing restriction information from the storage 2. In this step S8, there is no possibility that the clock lines are obstructive to the layout of the signal lines. This is because none of the clock lines that have been laid out overlaps with the prohibited terminals 13b, 14, and 15b with respect to the lines in the n-th wiring layer.

Figure 11:
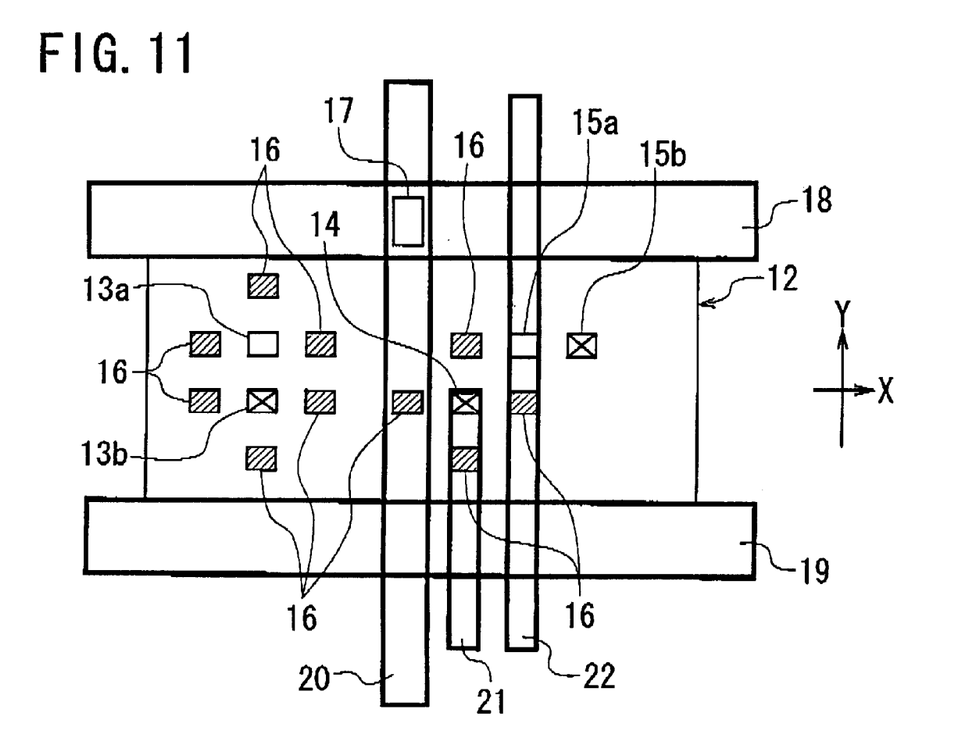
FIG. 11 is a schematic plan view showing the state of the primitive cell of FIG. 9 after the step S8 in FIG. 8 is completed.

FIG. 11 shows the result of the above-described step S8 in the primitive cell 12. As seen from FIG. 11, the clock line 22 in the n-th wiring layer does not overlap with the prohibited terminal 14 that prohibits its overlapping with any line located in the n-th wiring layer. Thus, a signal line 21 is vertically laid out to overlap with the terminal 14 and is connected to the terminal 14 at its end. Any other signal lines in the n-th wiring layer are laid out in the same way as described here.

With the method of designing the layout for an IC according to the first embodiment of the invention, as explained above in detail, the "connectable terminals" (e.g., the terminals 13a and 15a in FIG. 10) that are allowed to be connected to a line or lines in a specific wiring layer (e.g., in the n-th wiring layer) and the "prohibited terminals" (e.g., the terminals 13b, 14, and 15b) that are prohibited from being connected to the line or lines in the same specific wiring layer (e.g., in the n-th wiring layer) are defined by the clock line routing section 7 in the step S6 on the basis of the terminal information extracted in the step S5.

Thereafter, the clock lines are laid our in such a way as not to overlap with the prohibited terminals (e.g., the terminals 13b, 14, and 15b) in the same wiring layer in the step S8. In other words, some of the terminals to be connected to the signal lines in a specific wiring layer are preferentially determined or selected in advance and then, the clock lines are routed so as not to overlap with the terminal thus defined.

As a result, the signal lines can be laid out or routed without obstruction by the clock lines that have already been laid out. Thus, the re-routing operation required in the previously explained prior-art method is unnecessary, which eliminates the amendment or positional shift of the optimized layout of the clock lines through the CTS process.

Besides, there is no possibility that short-circuited and unconnected signal lines are formed.

SECOND EMBODIMENT

Figure 12:
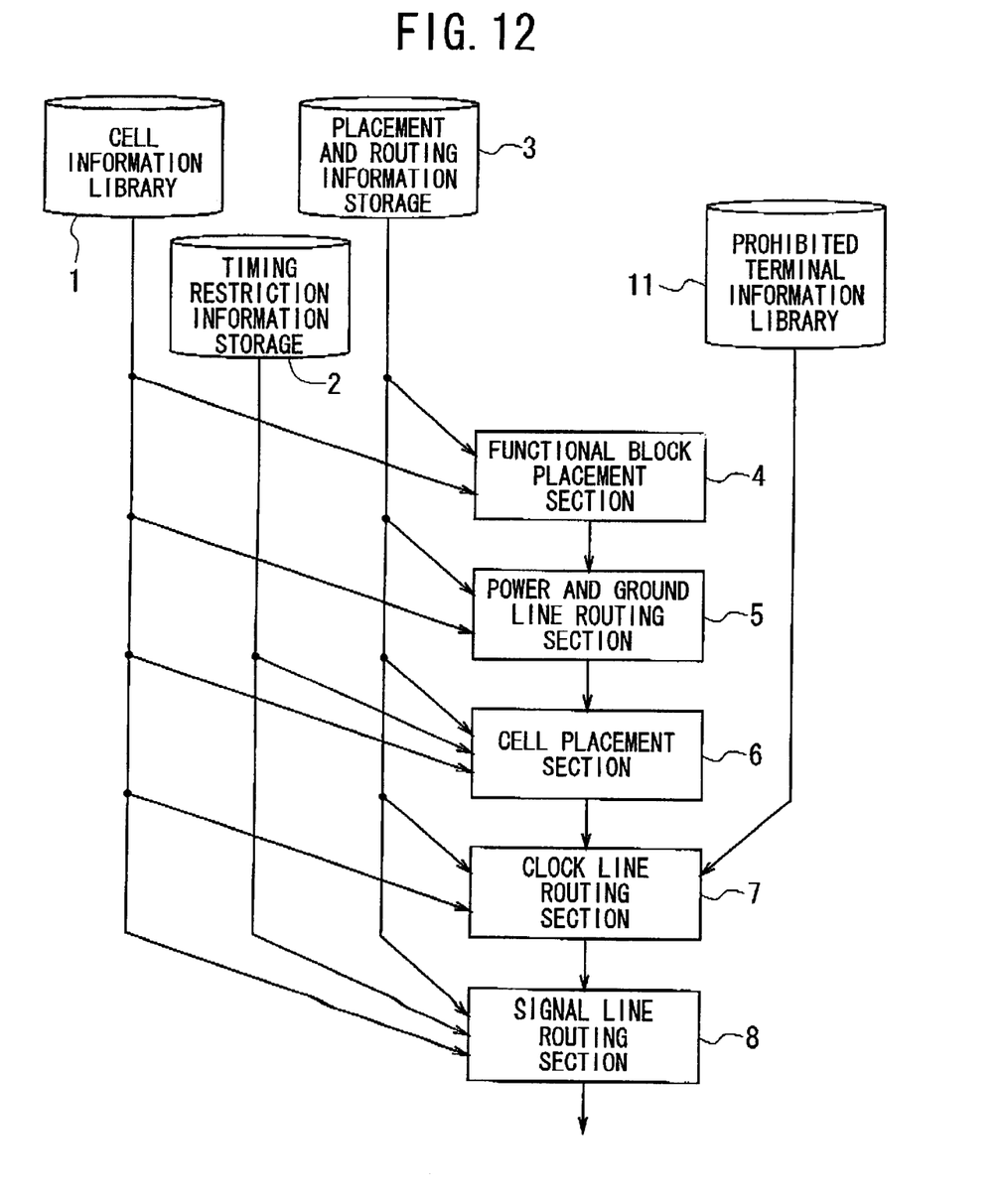
FIG. 12 is a schematic, functional block diagram showing the configuration of the layout section of a CAD tool for conducting a method of designing the layout for ICs according to a second embodiment of the invention.

FIG. 12 shows the layout section of a CAD tool used for conducting a method of designing the layout for an IC according to a second embodiment of the invention.

The system in FIG. 12 comprises the same configuration as the system shown in FIG. 7 used in the method according to the first embodiment, except that a prohibited terminal information library 11 is provided instead of the cell and terminal information library 10. Therefore, the detailed description about the same configuration is omitted here for the sake of simplification of description by attaching the same reference numerals as used in the first embodiment to the same elements in FIG. 12.

In the layout section of FIG. 12, the library 11 stores the information about the terminals that are prohibited from being overlapped by clock lines located in each wiring layer as the "prohibited terminal information". The "prohibited terminal information" in the library 11 is read out and sent to the clock line routing section 7 as necessary.

Unlike the layout section of FIG. 7 used in the first embodiment, the cell information and the wiring layer information is sent to the clock line routing section 7 from the cell information library 1.

Figure 13:
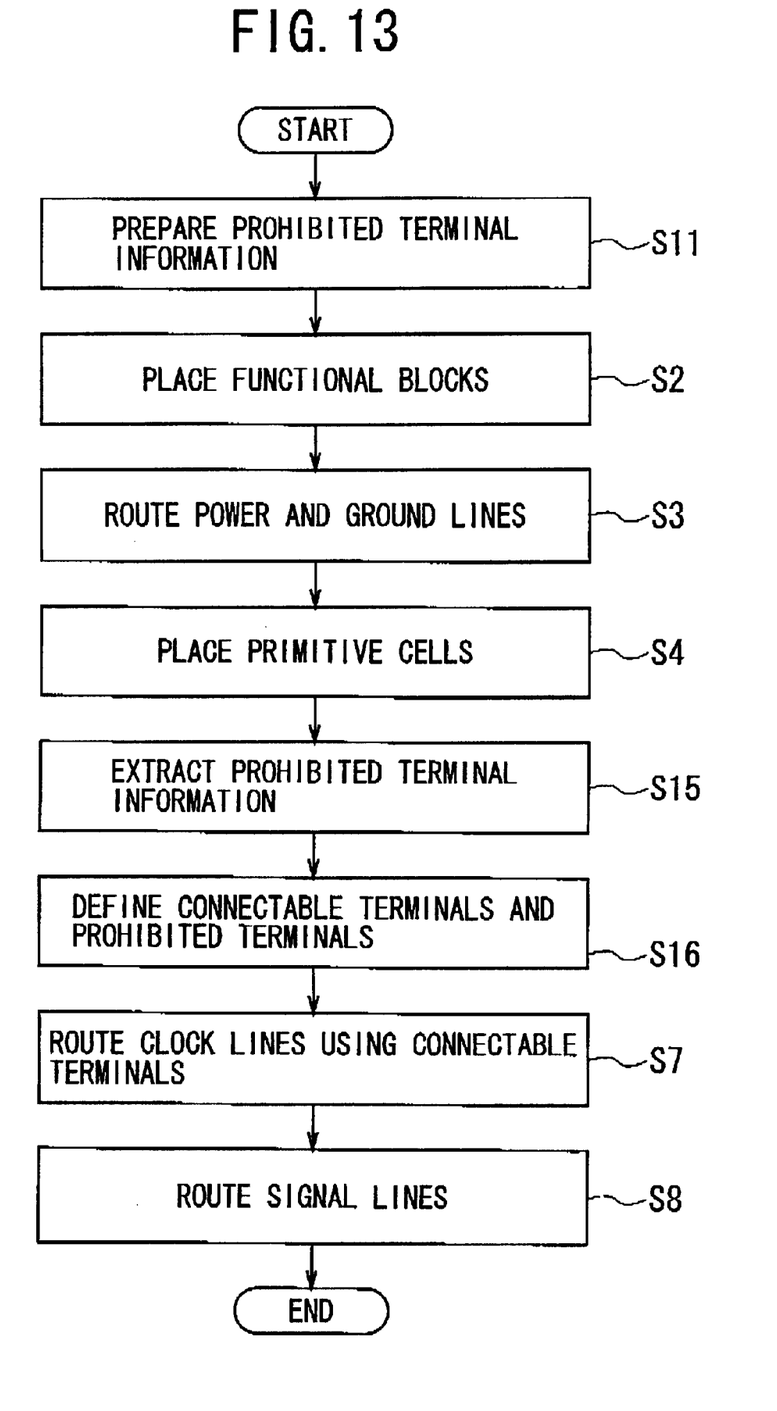
FIG. 13 is a flowchart showing the process steps of the method according to the second embodiment of the invention.

FIG. 13 shows the process steps of the method according to the second embodiment, in which the layout system shown in FIG. 12 is used.

The method of the second embodiment corresponds to one obtained by replacing the steps S1, S5, and S6 in the first embodiment with the steps S11, S15, and S16, respectively. Therefore, the explanation about the same steps as shown in the first embodiment is omitted here.

Figure 14:
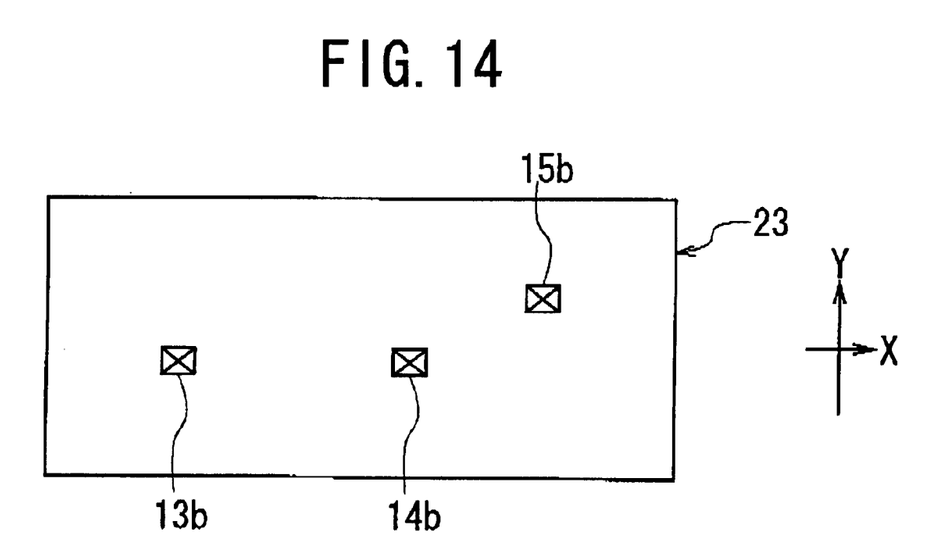
FIG. 14 is a schematic plan view showing an example of the layout in a primitive cell used in the method according to the second embodiment of the invention, in which signal lines are prohibited from overlapping with specific terminals.

In the method according to the second embodiment, first, the "prohibited terminal information" is prepared and stored in the library 11 in the step S11. For example, as shown in FIG. 14, a primitive cell 23 has prohibited terminals 13b, 14b, and 15b. In this case, the "prohibited terminal information" contains the definition or identification code that defines the terminals 13b, 14b, and 15b are prohibited from overlapping with any clock line in the n-th wiring layer.

Thereafter, the steps S2 to S4 in FIG. 13 are carried out in the same way as shown in the first embodiment.

In the next step S15, the clock line routing section 7 extracts the prohibited terminal information for each of the primitive cells thus laid out from the prohibited terminal information library 11.

In the next step S16, the clock line routing section 7 determines whether or not a clock line or lines in each wiring layer is/are prohibited from overlapping with the terminal or terminals located in the same wiring layer on the basis of the cell information from the cell information library 1 and the prohibited terminal information thus extracted in the step S15. In other words, the section 7 defines the "connectable terminals" that are allowed to be connected a clock line or lines in a specific wiring layer and the "prohibited terminals" that are prohibited from being connected to the clock line or lines in the same wiring layer.

Following this step S16, the steps S7 and S8 in FIG. 13 are carried out in the same way as shown in the first embodiment.

With the method of designing the layout for an IC according to the second embodiment of the invention, like the method of the first embodiment, the "connectable terminals" and the "prohibited terminals" in each wiring layer are defined in the clock line routing section 7 in the step S16 using the prohibited terminal information extracted in the step S15. Thereafter, the clock lines are laid our in such a way as not to overlap with the prohibited terminals in the same wiring layer. In other words, some of the terminals to be connected to the signal lines are preferentially determined or selected in advance and then, the clock lines are routed so as not to overlap with the terminal thus determined.

As a result, the signal lines can be laid out or routed without obstruction by the clock lines. Thus, the re-routing operation required in the previously explained prior-art method is unnecessary, which eliminates the amendment or positional shift of the optimized layout of the clock lines through the CTS process.

Besides, there is no possibility that short-circuited and unconnected signal lines are formed.

VARIATIONS

It is needless to say that the invention is not limited to the above-described first and second embodiments. For example, although the invention is applied to the n-th wiring layer and the (n−1)-th wiring layer located just below the n-th wiring layer, the invention may be applied to wiring layers with any other relationship (e.g., the n-th wiring layer and the (n−2)-th, the (n−3)-th, . . . , or the (n−m)-th wiring layers, where m is a natural number less than n).

Also, the invention may be applied to any other primitive cells or any other functional blocks.

While the preferred forms of the present invention have been described, it is to be understood that modifications will be apparent to those skilled in the art without departing from the spirit of the invention. The scope of the present invention, therefore, is to be determined solely by the following claims.

What is claimed is:

1. A method of designing layout for an IC using a CAD system, the method comprising the steps of:
   (a) define prohibited areas in each of stacked wiring layers;
   the prohibited areas causing an obstacle to define layout of signal lines in each of the wiring layers if a clock line is defined to intersect at least one of the prohibited areas;
   (b) defining layout of clock lines in each of wiring layers through a clock tree synthesis process in such a way that none of the clock lines intersects the prohibited areas; and
   (c) defining layout of signal lines in each of the wiring layers after the step (b).

2. The method according to claim 1, wherein each of the prohibited areas includes a terminal to which one of the signal lines is to be connected.

3. The method according to claim 1, further comprising;
   a step of providing prohibited area information about a primitive cell including at least one of the prohibited areas;
   wherein the prohibited area information is used in the clock tree synthesis process in the step (b).

4. The method according to claim 1, further comprising;
   a step of providing prohibited terminal information about terminals corresponding to the prohibited areas;
   wherein the prohibited terminal information is used in the clock tree synthesis process in the step (b).

5. The method according to claim 1, wherein the clock lines and the signal lines are located in a same one of the wiring layers.

6. The method according to claim 5, the clock lines and the signal lines extend in a same direction.

7. A method of designing layout for an IC using a CAD system, said method comprising the steps of:
   (a) providing prohibited area information about primitive cells including at least one of prohibited areas;
   the prohibited areas causing an obstacle to define layout of signal lines if clock lines are defined to intersect the prohibited areas;
   (b) providing cell information about primitive cells excluding the prohibited areas;
   (c) placing functional blocks using the cell information;
   (d) routing power lines and ground lines using the cell information;
   (e) placing primitive cells using the cell information;
   (f) routing clock lines through a clock tree synthesis process using the prohibited area information; and
   (g) routing signal lines using the cell information.

8. The method according to claim 7, wherein placement information about the primitive cells and routing information about the signal lines and the clock lines among the primitive cells is used in each of the steps (c) to (g);
   and wherein timing restriction information is additionally used in each of the steps (e) and (f).

9. A method of designing layout for an IC using a CAD system, said method comprising the steps of:
   (a) providing prohibited terminal information about primitive cells including at least one of prohibited terminals;
   the prohibited terminals causing an obstacle to define layout of signal lines if clock lines are defined to intersect the prohibited terminals;
   (b) providing cell information about primitive cells excluding the prohibited terminals;
   (c) placing functional blocks using the cell information;
   (d) routing power lines and ground lines using the cell information;
   (e) placing primitive cells using the cell information;
   (f) routing clock lines through a clock tree synthesis process using the prohibited terminal information; and
   (g) routing signal lines using the cell information.

10. The method according to claim 9, wherein placement information about the primitive cells and routing information about the signal lines and the clock lines among the primitive cells is used in each of the steps (c) to (g);
   and wherein timing restriction information is additionally used in each of the steps (e) and (f).

* * * * *